United States Patent
Iorga et al.

(10) Patent No.: US 9,564,909 B1
(45) Date of Patent: Feb. 7, 2017

(54) METHOD AND CIRCUIT FOR DELAY ADJUSTMENT MONOTONICITY IN A DELAY LINE

(71) Applicant: Rambus Inc., Sunnyvale, CA (US)

(72) Inventors: Cosmin Iorga, Newbury Park, CA (US); Sriram Narayan, Pleasanton, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/861,079

(22) Filed: Sep. 22, 2015

(51) Int. Cl.
 *H03H 11/26* (2006.01)
 *H03L 7/081* (2006.01)

(52) U.S. Cl.
 CPC ................................ *H03L 7/0818* (2013.01)

(58) Field of Classification Search
 None
 See application file for complete search history.

(56) References Cited

U.S. PATENT DOCUMENTS

| 6,259,330 | B1* | 7/2001 | Arai ........................ | H03K 3/011 331/177 R |
| 7,855,584 | B2* | 12/2010 | Easwaran ............. | H03L 7/0812 327/149 |
| 2005/0024107 | A1* | 2/2005 | Takai ..................... | H03K 5/133 327/158 |
| 2007/0115035 | A1* | 5/2007 | Hinz ...................... | H03K 5/135 327/156 |
| 2009/0289676 | A1* | 11/2009 | Takai ...................... | H03K 5/13 327/158 |
| 2014/0002155 | A1* | 1/2014 | Park ....................... | H03L 7/0802 327/158 |

* cited by examiner

*Primary Examiner* — Cassandra Cox
(74) *Attorney, Agent, or Firm* — Lowenstein Sandler LLP

(57) ABSTRACT

A delay circuit device configured for delay adjustment monotonicity and method of operating therefor. This delay circuit device is configured with hybrid coarse-fine delay cells and uses a sequence of these delay cells activated in a way that builds-up the delay as a sequence of fine steps until it reaches the coarse delay value. This configuration allows for the continuing build of propagation delay by adding the fine steps of the following delay cells. In this manner, the monotonicity of the signal delay circuit is ensured by the architecture independent from device mismatch, thus eliminating problems with conventional delay circuits such as gaps and overlaps specific the these conventional delay cells.

20 Claims, 7 Drawing Sheets

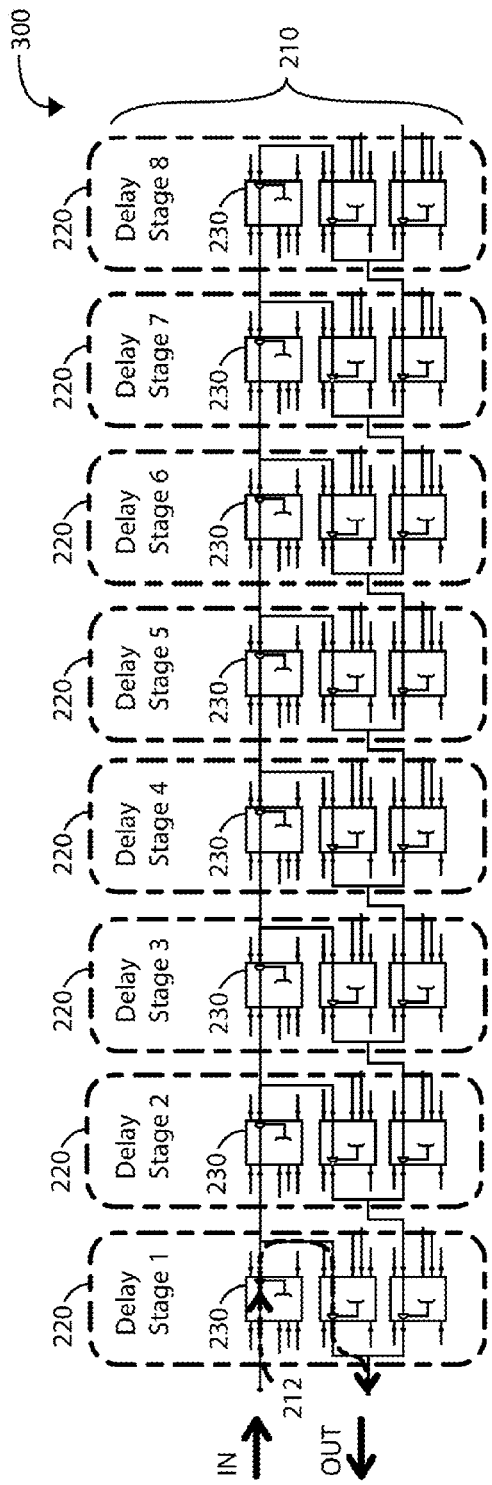
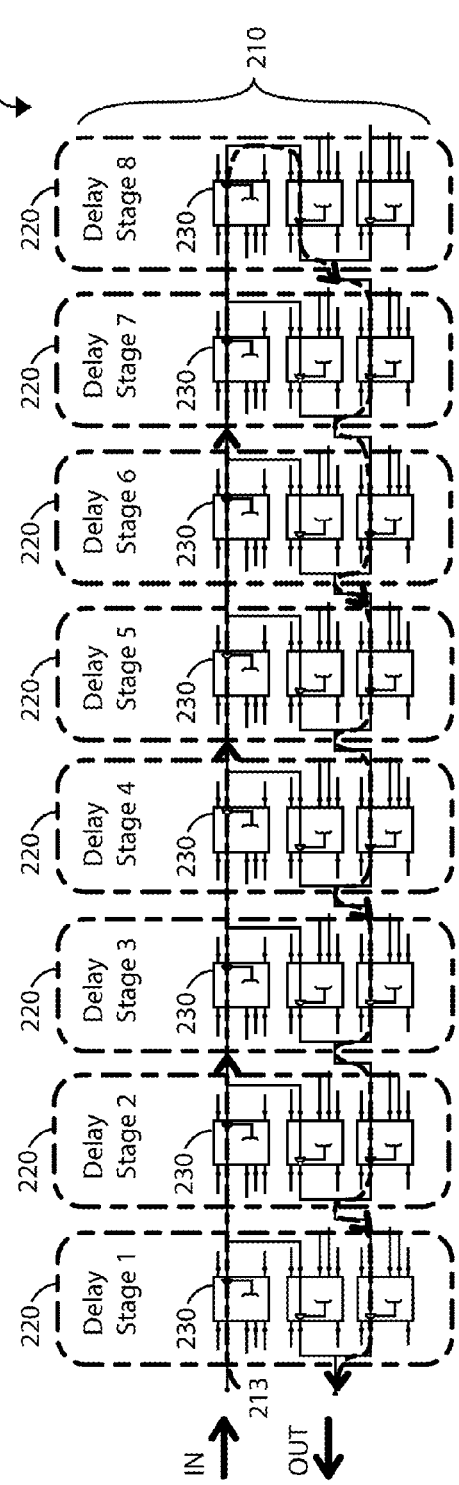
FIGURE 3
FIGURE 4

METHOD AND CIRCUIT FOR DELAY ADJUSTMENT MONOTONICITY IN A DELAY LINE

CROSS-REFERENCES TO RELATED APPLICATIONS

N/A

BACKGROUND OF THE INVENTION

The present invention relates to communication systems and integrated circuit (IC) devices. More particularly, the present invention provides a method and circuit for delay adjustment monotonicity in a delay line.

Over the last few decades, the use of communication networks has exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

CMOS technology is commonly used to design communication systems implementing Optical Fiber Links. This technology continues to be scaled down to make circuits and systems run at higher speed, use less power, and occupy smaller chip (die) area. Another critical aspect of communication systems is the interaction of input and output signals between multiple internal components in order to have a functional system. Communication systems with multiple internal devices that face device mismatch problems with signal timing and signal ranges can suffer from serious failures at the system level. Limitations such as these provide significant challenges to the continued improvement of communication systems scaling and performance.

Accordingly, improvements to circuits and techniques for propagation delay adjustments in delay lines are highly desirable.

BRIEF SUMMARY OF THE INVENTION

The present invention relates to communication systems and integrated circuit (IC) devices. More particularly, the present invention provides a method and delay circuit device configured for delay adjustment monotonicity. This device configuration allows for the continuing build of propagation delay by adding the fine steps of the following delay cells, in order to eliminate problems with conventional delay circuits such as gaps and overlaps specific the these conventional delay cells. Of course, there can be variations, modifications, and alternatives.

There are many delay lines used in the industry for data communication systems, and the like, which use various edge shifting techniques. Most of these conventional embodiments use multiple coarse delay elements and a fine delay element that spans the range of one of the coarse delay elements with fine resolution. However, these architectures suffer performance drawbacks due to the device mismatch in which the range of the fine delay element does not equal the range of the coarse delay element. This mismatch creates gaps or overlaps in the linearity of edge delay causing the delay circuit device to be non-monotonic, which can lead to serious failures at the system level.

In an embodiment, the present invention provides a delay circuit device having a plurality of delay stages and a delay circuit input, a delay circuit output, and a delay code input. Each of the delay stages includes a first delay cell having a first delay input and a first delay output, a second delay cell having a second delay input and a second delay output, and a third delay cell having a third delay input and a third delay output. The first delay input is electrically coupled to a first input node, and the first delay output and the second delay input are electrically coupled to a first joint node. The third delay input is electrically coupled to a second input node, wherein second delay output and the third delay output are electrically coupled to a second joint node.

In an embodiment, each of the first, second, and third delay cells is a hybrid coarse-fine delay cell that includes a signal strength level configured by the delay code input to produce a propagation delay for an input signal that ranges from zero delay to a coarse delay amount with incremental fine delay amounts. The plurality of delay stages are configured in a series connection wherein the first delay stage in the series connection has the first input node configured to the delay circuit input and the second joint node configured to the delay circuit output. Each delay stage is also configured such that the first joint node of the delay stage is electrically coupled to the first input node of an adjacent delay stage and the second input node of the delay stage is electrically coupled to the second joint node of the adjacent delay stage.

In an embodiment, a method for modulating an input signal using a delay circuit device having a plurality of delay stages configured in a series connection, each of the delay stages having a three hybrid coarse-fine delay cells. The method includes receiving a select code associated with a desired signal propagation delay at a delay code input of the plurality of delay stages, wherein each delay cell is configured by the select code to produce a propagation delay for the input signal. The method includes determining a signal strength level for each of the delay cells in each of the delay stages in the plurality of delay stages in order to form a signal delay path through a number of the delay cells across the plurality of delay stages in order to produce the desired signal propagation delay. The method also includes receiving an input signal at a delay circuit input on the plurality of delay stages.

In an embodiment, the method can include transmitting the input signal from the first input node of the first delay stage to a first joint node of the first delay stage and through the signal delay path to a second input node of the first delay stage. The input signal is subjected to the desired propagation delay in order to become a delayed input signal and this delayed input signal is transmitted to the delay circuit output from the second input node of the first delay stage through a second joint node of the first delay stage in the plurality of delay stages.

According to various embodiments of the present invention, delay circuits of this configuration allow for the continuing build of propagation delay by adding the fine steps of hybrid delay cells in order to reach the coarse delay amounts. These fine delay steps are achieved by signal interpolation between delay cells, which have select lines to determine a signal strength level in order to modulate the output signal.

Many benefits are recognized through various embodiments of the present invention. Such benefits include having the ability to maintain delay monotonicity through device architecture in order to avoid problems with device mismatches. Signal delay circuits using the present device architecture function without suffering from device mismatch, thus eliminating problems such as gaps and overlaps specific to these conventional coarse and fine delay cells.

Other benefits of these configurations will be recognized by those of ordinary skill in the art.

BRIEF DESCRIPTION OF THE DRAWINGS

FIG. 3 is a simplified circuit diagram illustrating a delay circuit device according to an embodiment of the present invention.

FIG. 4 is a simplified circuit diagram illustrating a delay circuit device according to an embodiment of the present invention.

DETAILED DESCRIPTION OF THE INVENTION

Figure 1A:
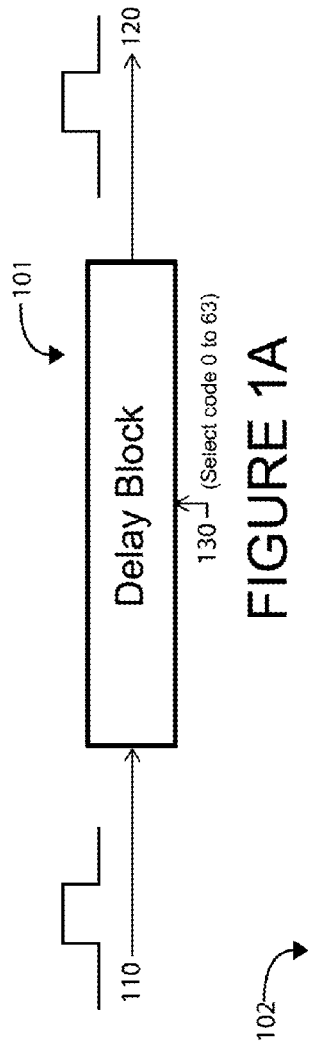
FIG. 1A is a simplified block diagram illustrating a signal delay cell according to an embodiment of the present invention.

The present invention relates to communication systems and integrated circuit (IC) devices. More particularly, the present invention provides a method and circuit for delay adjustment monotonicity in a delay line. This device configuration allows for the continuing build of propagation delay by adding the fine steps of the following delay cells, in order to eliminate problems with conventional delay circuits such as gaps and overlaps specific the these conventional delay cells. Of course, there can be variations, modifications, and alternatives.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

There are many delay lines used in the industry for data communication systems, and the like, which use various edge shifting techniques. Most of these conventional embodiments use multiple coarse delay elements and a fine delay element that spans the range of one of the coarse delay elements with fine resolution. However, these architectures suffer performance drawbacks due to the device mismatch in which the range of the fine delay element does not equal the range of the coarse delay element. This mismatch creates gaps or overlaps in the linearity of edge delay causing the delay circuit device to be non-monotonic, which can lead to serious failures at the system level.

In an embodiment, the present invention provides a delay circuit device configured for delay adjustment monotonicity in a delay line. Embodiments of the delay circuit device are configured with hybrid coarse-fine delay cells and use a sequence of these delay cells activated in a way that builds-up the delay as a sequence of fine steps until it reaches the coarse delay value. This configuration allows for the continuing build of propagation delay by adding the fine steps of the following delay cells. In this manner, the monotonicity of the signal delay circuit is ensured by the architecture independent from device mismatch, thus eliminating problems with conventional delay circuits such as gaps and overlaps specific the these conventional delay cells.

Figure 1B:
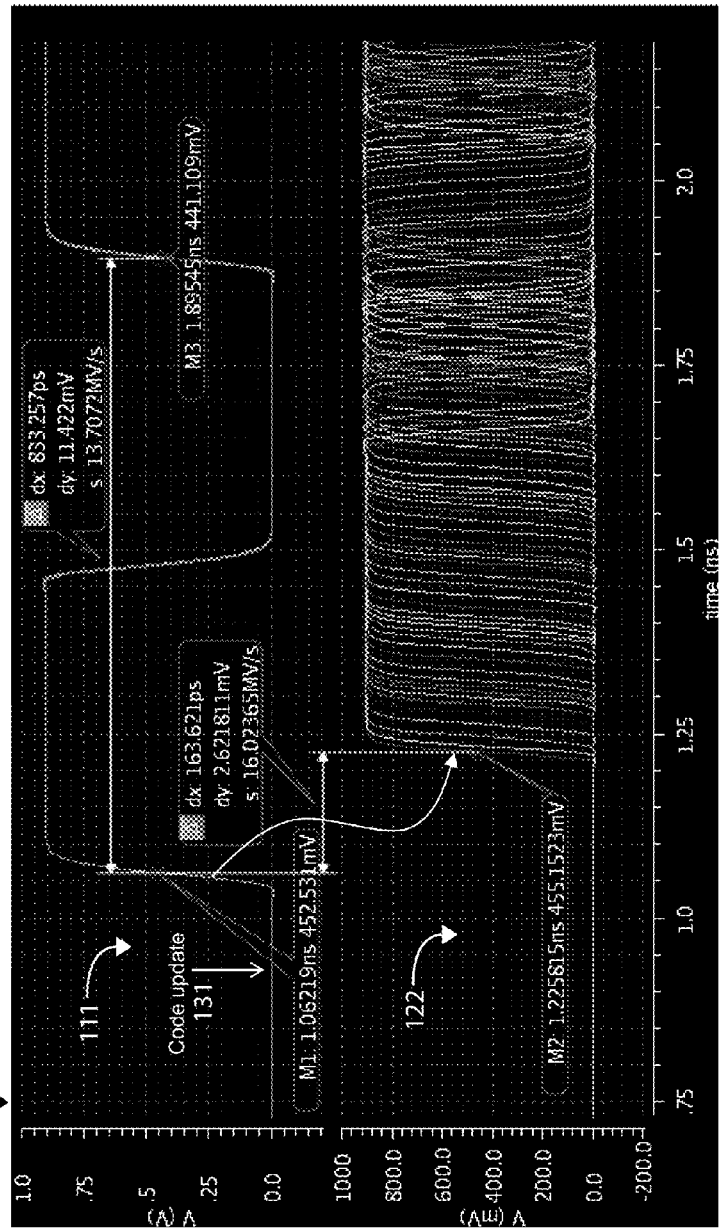
FIG. 1B is a simplified graph representing input and output signals of a signal delay cell according to an embodiment of the present invention.

FIG. 1A is a simplified block diagram illustrating a signal delay cell according to an embodiment of the present invention. As shown, signal delay cell 101 can include an input 110, an output 120, and a delay code input 130. Depending on the delay code input 130, a signal at the output 120 can be delayed by a predetermined time interval from the time that the signal entered the input 110. In a specific embodiment, the delay code input 130, or select code, can range from 0 to 63. As an example, the select codes (0 to 63) allow for fractional delays within a single period (e.g. 833 ps) of a signal waveform. FIG. 1B gives an example of the signal delay operation.

FIG. 1B is a simplified graph representing input and output signals of a signal delay cell according to an embodiment of the present invention. As shown, this graph 102 includes an input signal waveform 111 and a plurality of output signals 122. Code update indicator 131 shows a period when the select code is updated for the next delayed output. In a specific embodiment, the select code can trigger the start of a signal delay process at least a ½ cycle before the cycle on which the propagation delay is added. The plurality of output signals 122 shows output signals of varying signal propagation delays according to the select code.

Figure 2:
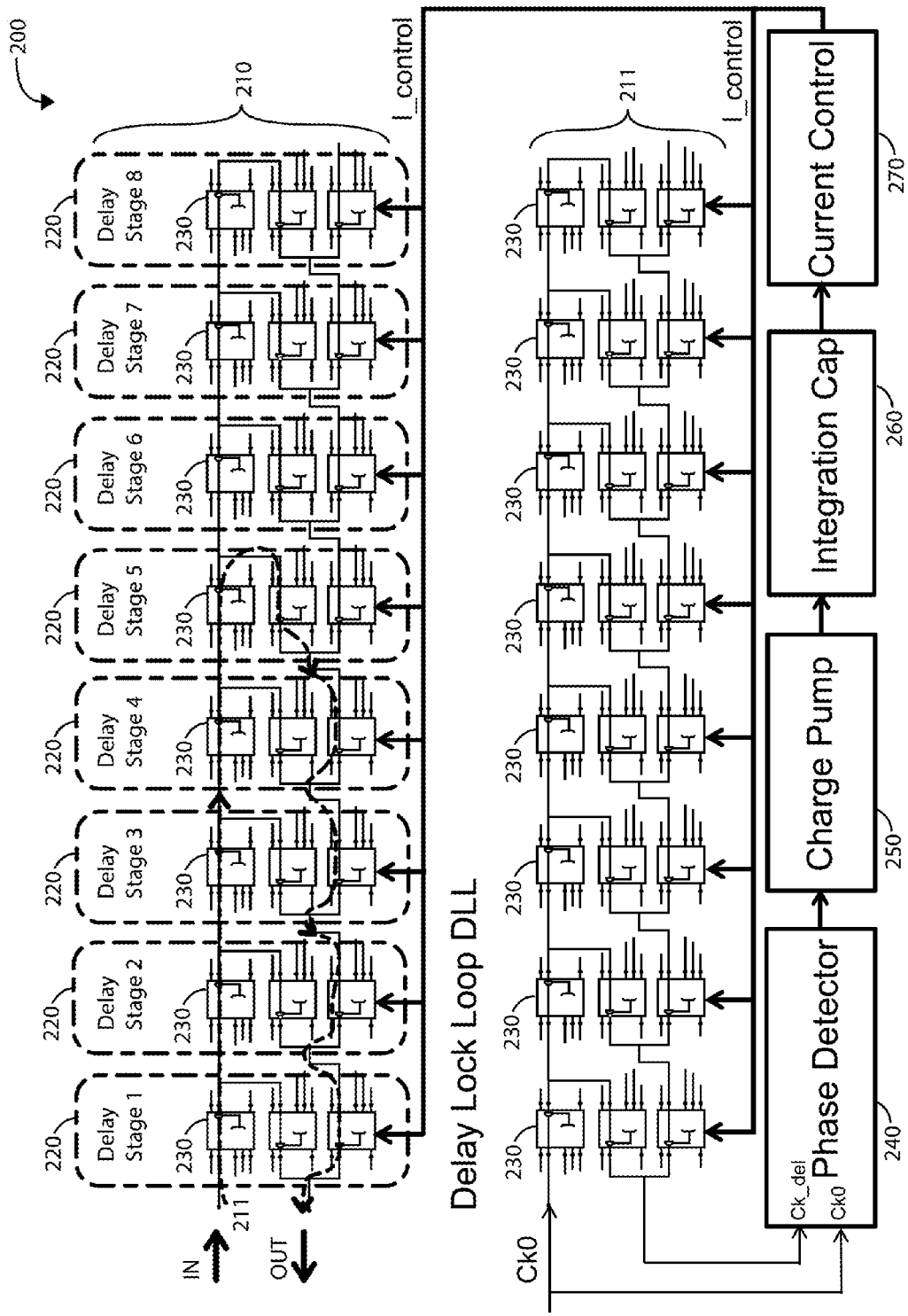
FIG. 2 is a simplified circuit diagram illustrating a delay circuit device according to an embodiment of the present invention.

FIG. 2 is a simplified circuit diagram illustrating a delay circuit device according to an embodiment of the present invention. As shown, the delay circuit device 200 can include a signal delay circuit 210. This delay circuit 210 can include a plurality of delay stages 220, which are electrically coupled together. Each delay stage 220 can include one or more delay cells 230. These delay cells 230, which are hybrid coarse-fine delay cells, are configured within the delay stages 220 in order to form a plurality of delay paths that provide varying signal propagation delays according to a delay code input. As an example, the delay circuit shown in FIG. 2 includes eight delay stages, each with three delay cells arranged in a column. Those of ordinary skill in the art will recognize other variations, modifications, and alternatives.

An arbitrary sample signal delay path 211 is shown by the dotted-line arrow. This sample path starts at the input and traverses stages 1 through 5 along the top (first) delay cells. At stage 5, the signal path returns through the middle (second) delay cell of delay stage 5. The signal path then moves to the bottom (third) delay cell of stage 4. From there, the signal path returns to the output at stage 1 along the bottom (third) delay cells of stages 1 through 4. Each of these delay cells can be configured with a standard coarse delay interval (e.g. 100 ps) such that traversing the signal delay path through "n" number of delay cells will result in a delay of n*(coarse delay). In the case of a 100 ps coarse delay, this arbitrary delay path would result in a (10*100 ps)=1 ns delay. Further details of the signal delay path are described later on for FIGS. 6A and 6B.

In an embodiment, the delay circuit device can include a Delay Lock Loop (DLL) circuit 211. This DLL circuit 211 includes the same delay stage/cell 220/230 configuration as the signal delay circuit 210. However, this DLL circuit takes a clock signal (Ck0) as an input and outputs a delayed clock signal (Ck_del). Both the clock signal and delayed clock signal feed into a phase detector 240, which is coupled in series to a charge pump 250, an integration cap 260, and a current control module 270. The current control module 270 is coupled to both the signal delay circuit 210 and the DLL circuit 211.

In a specific embodiment, the current control module 270 is coupled to each cell of the signal delay circuit 210 and each stage of the DLL circuit 211 by current control lines (I_control). These current control lines provide a bias current, or a control current, to the signal delay circuit stages that matches the bias current to the DLL circuit stages, thus maintaining a delay per stage constant over process, temperature, and voltage variations. Of course, there can be other variations, modifications, and alternatives.

FIG. 3 is a simplified circuit diagram illustrating a delay circuit device according to an embodiment of the present invention. As shown, delay circuit device 210 is similar to the delay circuit 210 of FIG. 2. Similarly, the delay circuit device 210 includes delay stages 220 with delay cells 230. Compared to FIG. 2, this figure shows the shortest signal delay path 212. This path enters the input of the top (first) delay cell of stage 1 and exits through the middle (second) delay cell of stage 1. In the case of a 100 ps coarse delay, this shortest delay path would result in a (1*100 ps)=100 ps delay.

FIG. 4 is a simplified circuit diagram illustrating a delay circuit device according to an embodiment of the present invention. As shown, delay circuit device 210 is similar to the delay circuit 210 of FIG. 2. Similarly, the delay circuit device 210 includes delay stages 220 with delay cells 230. Compared to FIGS. 2 and 3, this figure shows the longest signal delay path 213. This path enters the input of the top (first) delay cell of stage 1 and continues through all of the top (first) delay cells of stages 1 through 8. At stage 8, the longest signal delay path comes back through the middle (second) delay cell of stage 8 and down to the bottom (third) delay cell of stage 7. From stage 7, this delay path returns to the bottom (third) delay cell of stage 1 while traversing all of the bottom (third) delay cells of stages 1 through 7. In the case of a 100 ps coarse delay, this longest delay path would result in (16*100 ps)=1.6 ns delay.

Figure 5:
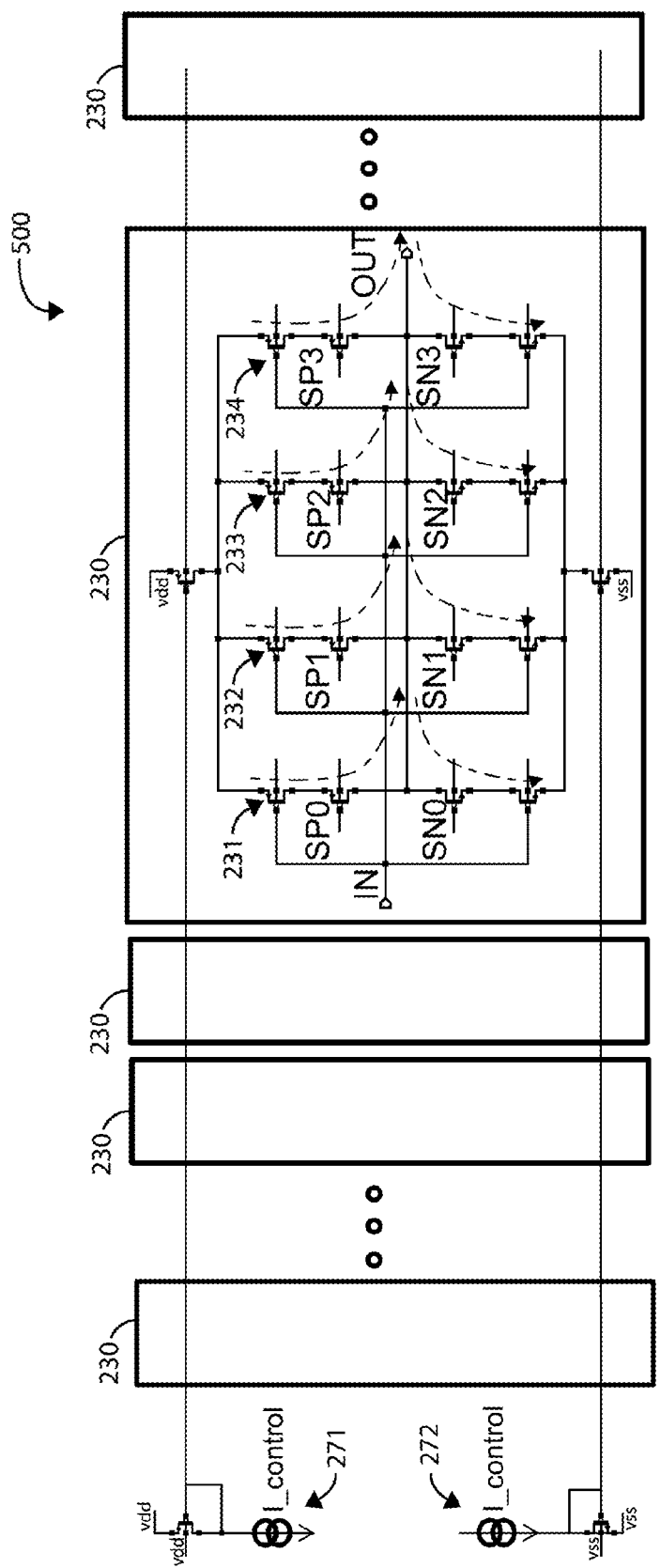
FIG. 5 is simplified circuit diagram illustrating a delay circuit device according to an embodiment of the present invention.

FIG. 5 is simplified circuit diagram illustrating a delay circuit device according to an embodiment of the present invention. As shown, delay circuit device 500 includes a plurality of signal delay cells 230 coupled to two current mirrors 271, 272, which provide the circuit device 500 with the control current described previously for FIG. 2. FIG. 5 also provides further details of the signal delay cell 230. In an embodiment, each delay cell 230 can include multiple select lines associated with multiple delay strength levels. As an example, a signal delay cell 230 can have four select lines associated with four signal strength levels. In this figure, each select line includes a pair of PMOS transistors, denoted as SP0-SP3, and a pair of NMOS transistors, denoted as SN0-SN3.

In a specific embodiment, each signal delay cell 230 includes four select lines, which can be inverter lines that can be enabled and disabled. Each of these select lines includes a first and second PMOS transistor as well as a first and second NMOS transistor. The gates of each of the first PMOS and NMOS transistors are coupled to an input of the signal delay cell. The sources of each of the first PMOS and NMOS transistors are coupled to the first and second current mirrors 271, 272, respectively. The drains of each of the first PMOS and NMOS transistors are coupled to the sources of the second PMOS and NMOS transistors, respectively, within each select line. The drains of each of the second PMOS and NMOS transistors are coupled to an output of the signal delay cells. Thus, the gates of the second PMOS and NMOS transistors control whether the select lines are turned on or off, determining the signal strength level of the signal delay cell.

Figures 6A, 6B:
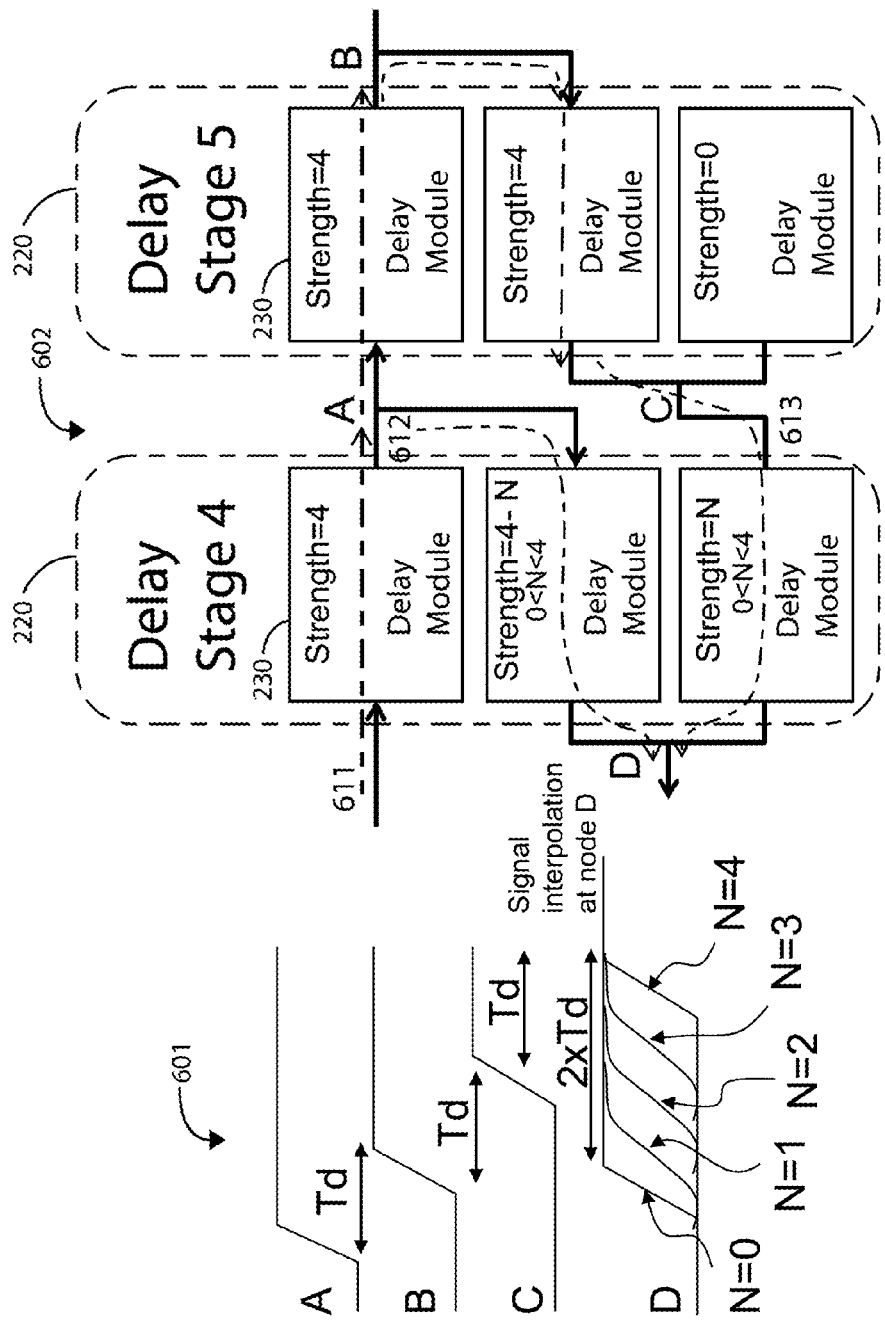
FIG. 6A is a simplified timing diagram illustrating a method of delay adjustment monotonicity in a delay circuit device according to an embodiment of the present invention.
FIG. 6B is a simplified block diagram illustrating a portion of a delay circuit device according to an embodiment of the present invention.

FIG. 6A is a simplified timing diagram illustrating a method of delay adjustment monotonicity in a delay circuit device according to an embodiment of the present invention. As shown, timing diagram 601 shows the effects of the signal propagation delay at nodes A through D. These nodes correspond to nodes A through D in FIG. 6B. In an embodiment, each signal delay cell is a hybrid delay cell which provides both course and fine delay adjustments. As discussed previously, each delay cell is configured with a predetermined course delay amount (e.g. 100 ps). Using the select lines described in FIG. 5, each signal delay cell can also provide fine delay adjustments by signal interpolation.

In this example, four interpolation branches are used, but more than four branches can be used to improve timing resolution.

FIG. 6B is a simplified block diagram illustrating a portion of a delay circuit device according to an embodiment of the present invention. As shown, circuit device 602 includes two arbitrary delay stages, stages four and five, within a delay circuit device. Node A is configured at the output of the top (first) delay cell of stage four, while Node B is configured at the output of the top (first) delay cell of stage five. Node C is configured on the return path at the output of the middle (second) delay cell of stage five, and node D is configured at the joint output of the middle (second) and bottom (third) delay cells of stage 4.

In an embodiment, each delay stage of the signal delay circuit can include three delay cells: a first delay cell, a second delay cell, and a third delay cell. Each of these delay cells can include a delay input and a delay output. Each delay stage can be configured with four nodes: a first input node, a first joint node, a second input node, and a second joint node. These nodes are coupled to the inputs and outputs of the delay cells in a repeating configuration across all of the stages.

In a specific embodiment, each of these delay cells is an inverter delay cell in which the input signal is inverted after passing through each of these cells. Referring to FIG. 6A, the simplified timing diagram 601 is a conceptual timing diagram that does not show the inversion of the signal after each delay cell for an easier comparison of the delay amounts across the different nodes. Accounting for the signal inversions of each cell, the input signal 611 measured at nodes A and C, involving an odd number of inversions, would be inverted compared to the original input signal at 611. On the other hand, signal 611 measured at nodes B and D, involving an even number of inversions, is non-inverted compared to the original input signal.

Each node is electrically coupled to at least one of the delay cells. The first input node is electrically coupled to the delay input (first delay input) of the first delay cell. The first joint node is electrically coupled to the delay output (first delay output) of the first delay cell and the delay input (second delay input) of the second delay cell. The second input node is electrically coupled to the delay input (third delay input) of the third delay cell. The second joint node is electrically coupled to the delay output (second delay output) of the second delay cell and the delay output (third delay output) of the third delay cell. In a specific embodiment, these joint nodes are nodes configured for signal interpolation between the two connected delay cells depending upon the cell strength levels.

Similar to the configuration shown in FIG. 6B, the first joint node of a first delay stage is electrically coupled to the first input node of a second delay stage configured to be adjacent to the first delay stage. The second joint node of the second delay stage is electrically coupled to the second input node of the first delay stage. In this way, the signals are subjected to propagation delay as they travel through the first input node of a delay stage and come back through to the second joint node, just as in this example with traveling through nodes A to D.

In this example, the top delay cells of stages four and five at configured at the full signal strength level of four. This means that the signal passing through these two cells will be delayed by the full coarse delay (Td). The middle delay cell of stage five is also configured at full strength, while the bottom delay cell of stage five is configured at the minimum delay strength level of zero. This means that signals passing through the middle cell with also be subjected to the delay Td, but no signal will be passing through the bottom cell. The middle and bottom delay cells of stage 4 are marked as being at a variable signal strength levels 4-N and N, respectively, where 0<N<4. This means that the strength levels of the middle and bottom delay cells will always add up to the full signal strength level (e.g. strength level 4).

Referring back to FIG. 6A, node A shows the signal subjected to the least amount of propagation delay. The signal at node B is delayed from the signal at node A by Td, as expected with the full strength delay cell. Similarly, the signal at node C is delayed from the signal at node B by another Td. The span of signals at node D shows the range of possible fine delay increments due to signal interpolation by the strength levels of the middle and bottom delay cells of stage four. At N=0, the middle delay cell is turned on at full strength while the bottom delay cell is completely off. This case at node D provides a signal subjected to the same delay as measured at node B. At N=4, the middle delay cell is turned completely off while the bottom cell is on at full strength. This case at node D provides a signal subjected to a delay of 2×Td from the signal measured at node B. With the strength levels of N between 0 and 4, the effects of the incremental fine delays can be seen within the 2×Td span.

In an embodiment, the present invention provides a delay circuit device having a plurality of delay stages and a delay circuit input, a delay circuit output, and a delay code input. Each of the delay stages includes a first delay cell having a first delay input and a first delay output, a second delay cell having a second delay input and a second delay output, and a third delay cell having a third delay input and a third delay output. The first delay input is electrically coupled to a first input node, and the first delay output and the second delay input are electrically coupled to a first joint node. The third delay input is electrically coupled to a second input node, wherein second delay output and the third delay output are electrically coupled to a second joint node.

In an embodiment, each of the first, second, and third delay cells is a hybrid coarse-fine delay cell that includes a signal strength level configured by the delay code input to produce a propagation delay for an input signal that ranges from zero delay to a coarse delay amount with incremental fine delay amounts. The plurality of delay stages are configured in a series connection wherein the first delay stage in the series connection has the first input node configured to the delay circuit input and the second joint node configured to the delay circuit output. Each delay stage is also configured such that the first joint node of the delay stage is electrically coupled to the first input node of an adjacent delay stage and the second input node of the delay stage is electrically coupled to the second joint node of the adjacent delay stage.

In a specific embodiment, each of the first, second, and third delay cells includes M select lines, where M>=4, and wherein the signal strength level of a delay cell corresponds to a number of enabled select lines ranging from 0 to M. The signal strength level of the second delay cell is determined by (M−N), where the signal strength level M is associated with the coarse delay amount, while the signal strength level of the third delay cell determined by N, where 0<N<M; and wherein the propagation delay increases as N increases.

In a specific embodiment, the delay circuit device further includes a first current mirror and a second current mirror. Each of the select lines includes a first PMOS transistor, a second PMOS transistor, a first NMOS transistor, and a second NMOS transistor, each of these transistors having a gate, a source, and a drain. The gates of the first PMOS and first NMOS are coupled to the delay input of the delay cell, wherein the source of the first PMOS is coupled to the first current mirror and the source of the first NMOS is coupled to the second current mirror. The drain of the first PMOS is coupled to the source of the second PMOS and the drain of the first NMOS is coupled to the source of the second NMOS, and the drains of the second PMOS and the second NMOS are coupled to the delay output of the delay cell. Also, the gates of the second PMOS and the second NMOS control whether the select line is enabled or disabled according to the delay code input.

In a specific embodiment, each of the delay stages is configured to interpolate an input signal at the second joint node using the second delay cell and the third delay cell of that delay stage. The delay code input ranges from 0 to 63 and the plurality of delay stages includes eight delay stages. The hybrid coarse-fine delay cell is configured for delay adjustment monotonicity having no gaps or overlaps between coarse and fine adjustment propagation delays.

In a specific embodiment, the delay circuit device further includes a phase detector having a clock input and a DLL input, a charge pump coupled to the phase detector, an integration cap coupled to the charge pump, a current control module coupled to the integration cap, and a Delay Lock Loop (DLL) circuit. The DLL circuit includes a plurality of DLL stages having a DLL circuit input, a DLL circuit output, and the delay code input, wherein the plurality of DLL stages is characterized by a duplicate architecture of the plurality of delay stages. A clock signal is coupled to the DLL circuit input and the clock input of the phase detector and the DLL circuit output is coupled to the DLL input of the phase detector. The current control module is coupled to each delay cell of each delay stage in the plurality of delay stages and the current control module is coupled to each delay cell of each DLL stage of the plurality of DLL stages.

In a specific embodiment, the current control module includes a first current mirror and a second current mirror, and the first current mirror and the second current mirror is coupled to each delay cell of each delay stage in the plurality of delay stages and each delay cell of each DLL stage in the plurality of DLL stages. The current control module is also configured to provide a bias control current to the plurality of delay stages in order to synchronize an input signal to the clock signal.

In an embodiment, the present invention provides a method for modulating an input signal using a delay circuit device having a plurality of delay stages configured in a series connection. Each of the delay stages includes a three hybrid coarse-fine delay cells. The method can include receiving a select code at a delay code input of the plurality of delay stages. The select code is associated with a desired signal propagation delay, wherein each delay cell is configured by the select code to produce a propagation delay for the input signal that ranges from zero delay to a coarse delay amount with incremental fine delay amounts.

The method can include determining a signal strength level for each of the delay cells in each of the delay stages in the plurality of delay stages in order to form a signal delay path through a number of the delay cells across the plurality of delay stages. The signal delay path is configured to produce the desired signal propagation delay. In a specific embodiment, determining the signal strength levels for each of the delay cells includes enabling a number of select lines using the gates of the second PMOS and the second NMOS, described previously, according to the delay code input, the number of select lines that are enabled corresponding to the signal strength level of that delay cell. The method can also include receiving an input signal at a delay circuit input on the plurality of delay stages, the input signal being directed to a first input node of a first delay stage in the plurality of delay stages.

The method can include transmitting the input signal from the first input node of the first delay stage to a first joint node of the first delay stage and through the signal delay path to a second input node of the first delay stage, wherein the input signal is subjected to the desired propagation delay in order to become a delayed input signal. In a specific embodiment, subjecting the input signal to the desired propagation delay includes subjecting the input signal to signal interpolation at the second joint node using the signal strength levels of the second delay cell and the third delay cell within a delay stage in order to delay the input signal by a number of fine delay adjustments. Subjecting the input signal to the desired propagation delay using the hybrid coarse-fine delay cells is free from signal gaps and overlaps due to device mismatch.

The method can also include transmitting the delayed input signal to the delay circuit output from the second input node of the first delay stage through a second joint node of the first delay stage in the plurality of delay stages. In a specific embodiment, transmitting the input signal through the signal delay path includes transmitting the input signal through a number of delay stages from the first delay stage to the last of the number of delay stages and back to the first delay stage. In a specific embodiment, the method includes providing, by the current control module described previously, a bias control current to the plurality of delay stages in order to synchronize the delayed input signal to the clock signal.

Many benefits of the present invention for data communication and signal propagation are provided. As described previously, delay circuits of this configuration allow for the continuing build of propagation delay by adding the fine steps of hybrid delay cells in order to reach the coarse delay amounts. These fine delay steps are achieved by signal interpolation between delay cells, which have select lines to determine a signal strength level in order to modulate the output signal. Signal delay circuits using the present device architecture function without suffering from device mismatch, thus eliminating problems such as gaps and overlaps specific to these conventional coarse and fine delay cells. Other benefits of these configurations will be recognized by those of ordinary skill in the art.

Figure 7:
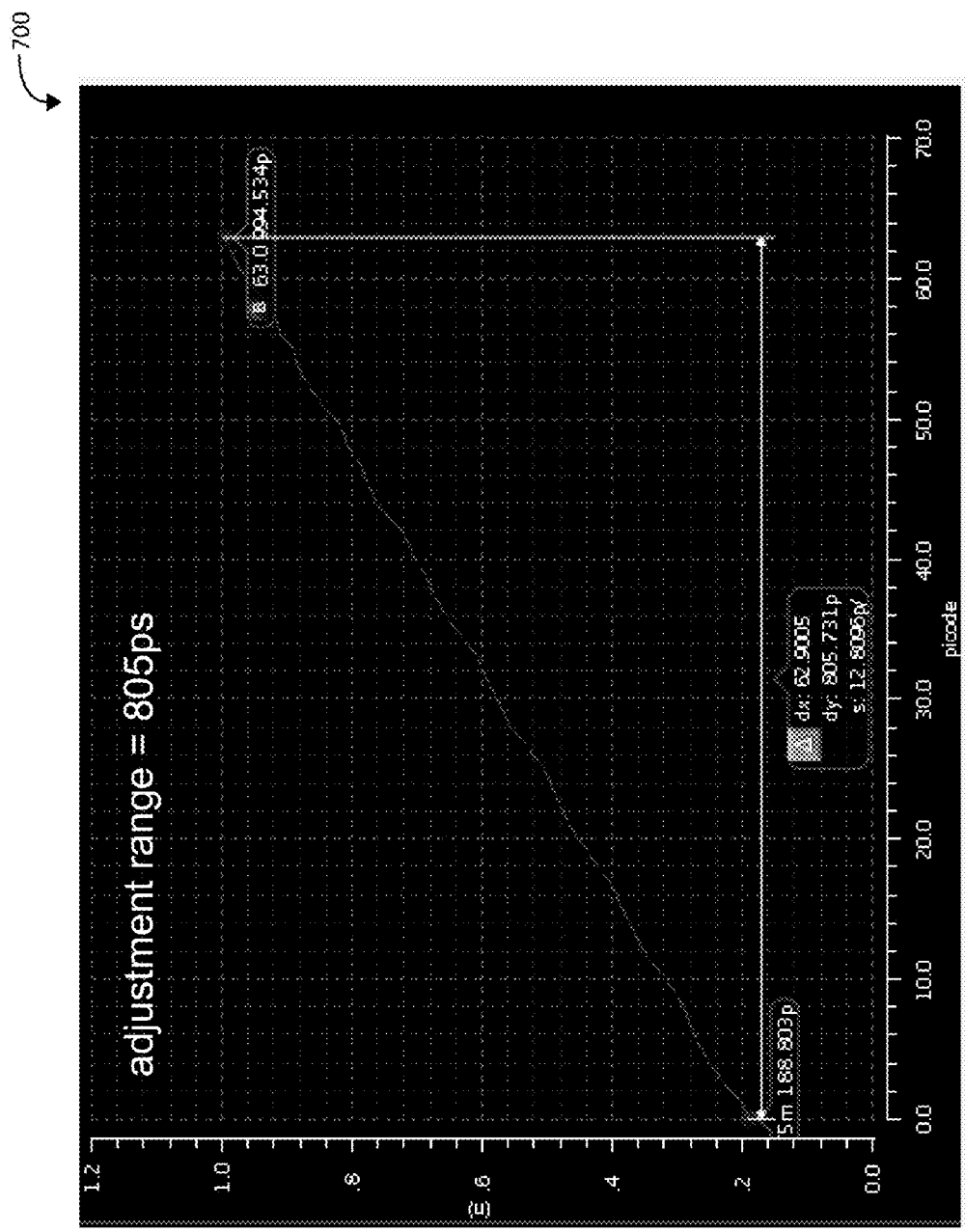
FIG. 7 is a simplified graph representing delay over delay code input according to an embodiment of the present invention.

FIG. 7 is a simplified graph representing delay over delay code input according to an embodiment of the present invention. As shown, graph 700 shows the span of the propagation delay adjustment according to the select code (0-63) with an adjustment range of about 805 ps. In this simulation, the delay adjustment ranges from 188.803 ps to 994.534 ps.

Figure 8:
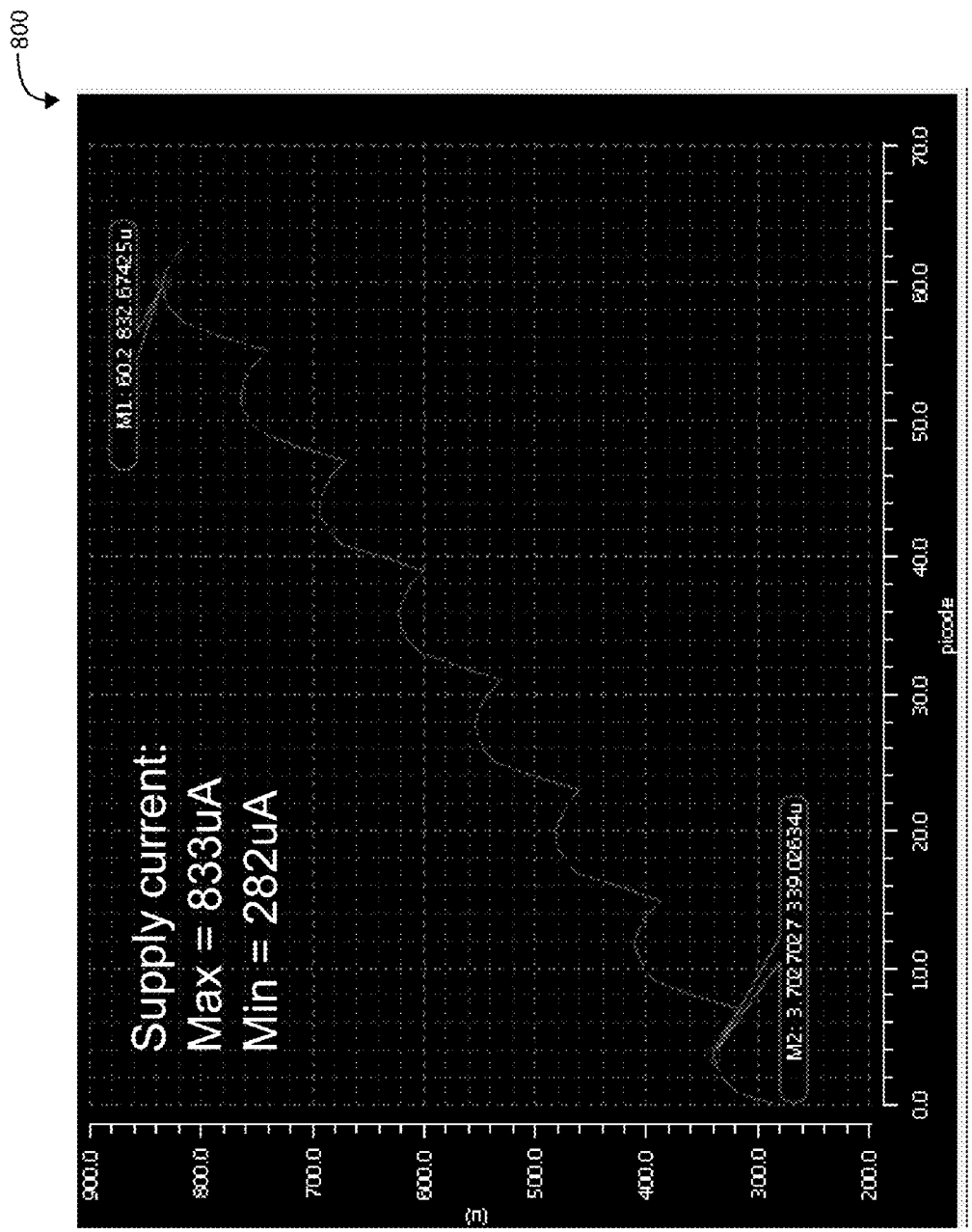
FIG. 8 is a simplified graph representing supply current over delay code input according to an embodiment of the present invention.

FIG. 8 is a simplified graph representing supply current over delay code input according to an embodiment of the present invention. As shown, graph 800 shows the supply current varying as the select code varies. In this simulation, the minimum current is measured at 282 uA and the maximum supply current is measured at 833 uA. Looking at the measured current, a non-linear undulating pattern can be seen as the select code increases. These surges in current correspond to the signal interpolation of the fine delay adjustment, such as the example shown in FIGS. 6A and 6B.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A delay circuit device comprising:
   a plurality of delay stages having a delay circuit input, a delay circuit output, and a delay code input, each of the delay stages including:
      a first delay cell having a first delay input and a first delay output;
      a second delay cell having a second delay input and a second delay output;
      a third delay cell having a third delay input and a third delay output;
      wherein the first delay input is electrically coupled to a first input node;
      wherein the first delay output and the second delay input are electrically coupled to a first joint node, the third delay input is electrically coupled to a second input node, wherein second delay output and the third delay output are electrically coupled to a second joint node; and
      wherein each of the first, second, and third delay cells is a hybrid coarse-fine delay cell that includes a signal strength level configured by the delay code input to produce a propagation delay for an input signal that ranges from zero delay to a coarse delay amount with incremental fine delay amounts;
   wherein the plurality of delay stages are configured in a series connection wherein the first delay stage in the series connection has the first input node configured to the delay circuit input and the second joint node configured to the delay circuit output; and
   wherein each delay stage is configured such that the first joint node of the delay stage is electrically coupled to the first input node of an adjacent delay stage and the second input node of the delay stage is electrically coupled to the second joint node of the adjacent delay stage.

2. The device of claim 1 wherein each of the first, second, and third delay cells includes M select lines, where M>=4, and wherein the signal strength level of a delay cell corresponds to a number of enabled select lines ranging from 0 to M.

3. The device of claim 2 further comprising a first current mirror and a second current mirror; and
   wherein each of the select lines includes a first PMOS transistor, a second PMOS transistor, a first NMOS transistor, and a second NMOS transistor, each of these transistors having a gate, a source, and a drain;
   wherein the gates of the first PMOS and first NMOS are coupled to the delay input of the delay cell, wherein the source of the first PMOS is coupled to the first current mirror and the source of the first NMOS is coupled to the second current mirror, wherein the drain of the first PMOS is coupled to the source of the second PMOS and the drain of the first NMOS is coupled to the source of the second NMOS, wherein the drains of the second PMOS and the second NMOS are coupled to the delay output of the delay cell; and
   wherein the gates of the second PMOS and the second NMOS control whether the select line is enabled or disabled according to the delay code input.

4. The device of claim 2 wherein each of the delay stages is configured to interpolate an input signal at the second joint node using the second delay cell and the third delay cell of that delay stage.

5. The device of claim 4 wherein the signal strength level of the second delay cell is determined by (M−N), where the signal strength level M is associated with the coarse delay amount, while the signal strength level of the third delay cell determined by N, where 0<N<M; and wherein the propagation delay increases as N increases.

6. The device of claim 1 further comprising
   a phase detector having a clock input and a DLL input;
   a charge pump coupled to the phase detector;
   an integration cap coupled to the charge pump;
   a current control module coupled to the integration cap; and
   a Delay Lock Loop (DLL) circuit including:
      a plurality of DLL stages having a DLL circuit input, a DLL circuit output, and the delay code input, wherein the plurality of DLL stages is characterized by a duplicate architecture of the plurality of delay stages;
   wherein a clock signal is coupled to the DLL circuit input and the clock input of the phase detector and the DLL circuit output is coupled to the DLL input of the phase detector; and
   wherein the current control module is coupled to each delay cell of each delay stage in the plurality of delay stages and the current control module is coupled to each delay cell of each DLL stage of the plurality of DLL stages.

7. The device of claim 6 wherein the current control module includes a first current mirror and a second current mirror, and the first current mirror and the second current mirror is coupled to each delay cell of each delay stage in the plurality of delay stages and each delay cell of each DLL stage in the plurality of DLL stages.

8. The device of claim 7 wherein the current control module is configured to provide a bias control current to the plurality of delay stages in order to synchronize an input signal to the clock signal.

9. The device of claim 1 wherein the delay code input ranges from 0 to 63 and the plurality of delay stages includes eight delay stages.

10. The device of claim 1 wherein the hybrid coarse-fine delay cell is configured for delay adjustment monotonicity having no gaps or overlaps between coarse and fine adjustment propagation delays.

11. A method for modulating an input signal using a delay circuit device having a plurality of delay stages configured in a series connection, each of the delay stages having a three hybrid coarse-fine delay cells, the method comprising:
   receiving a select code at a delay code input of the plurality of delay stages, the select code being associated with a desired signal propagation delay, wherein each delay cell is configured by the select code to produce a propagation delay for the input signal that ranges from zero delay to a coarse delay amount with incremental fine delay amounts;
   determining a signal strength level for each of the delay cells in each of the delay stages in the plurality of delay stages in order to form a signal delay path through a number of the delay cells across the plurality of delay stages, the signal delay path being configured to produce the desired signal propagation delay;
   receiving an input signal at a delay circuit input on the plurality of delay stages, the input signal being directed to a first input node of a first delay stage in the plurality of delay stages;
   transmitting the input signal from the first input node of the first delay stage to a first joint node of the first delay stage and through the signal delay path to a second input node of the first delay stage, wherein the input signal is subjected to the desired propagation delay in order to become a delayed input signal; and transmitting the delayed input signal to the delay circuit output from the second input node of the first delay stage through a second joint node of the first delay stage in the plurality of delay stages.

12. The method of claim 11 wherein each of the delay stages comprises:
a first delay cell having a first delay input and a first delay output;
a second delay cell having a second delay input and a second delay output;
a third delay cell having a third delay input and a third delay output;
wherein the first delay input is electrically coupled to a first input node;
wherein the first delay output and the second delay input are electrically coupled to a first joint node, the third delay input is electrically coupled to a second input node, wherein second delay output and the third delay output are electrically coupled to a second joint node; and
wherein subjecting the input signal to the desired propagation delay includes subjecting the input signal to signal interpolation at the second joint node using the signal strength levels of the second delay cell and the third delay cell within a delay stage in order to delay the input signal by a number of fine delay adjustments.

13. The method of claim 12 wherein the first delay stage in the series connection has the first input node configured to the delay circuit input and the second joint node configured to the delay circuit output, wherein each delay stage is configured such that the first joint node of the delay stage is electrically coupled to the first input node of an adjacent delay stage and the second input node of the delay stage is electrically coupled to the second joint node of the adjacent delay stage; and
wherein transmitting the input signal through the signal delay path includes transmitting the input signal through a number of delay stages from the first delay stage to the last of the number of delay stages and back to the first delay stage.

14. The method of claim 11 wherein each delay cell includes M select lines, where M>=4, and wherein the signal strength level of a delay cell corresponds to a number of enabled select lines ranging from 0 to M.

15. The method of claim 14 wherein each of the select lines includes a first PMOS transistor, a second PMOS transistor, a first NMOS transistor, and a second NMOS transistor, wherein the gates of the first PMOS and first NMOS are coupled to the delay input of the delay cell and the drains of the second PMOS and the second NMOS are coupled to the delay output of the delay cell; and
wherein determining the signal strength levels for each of the delay cells includes enabling a number of select lines using the gates of the second PMOS and the second NMOS according to the delay code input, the number of select lines that are enabled corresponding to the signal strength level of that delay cell.

16. The method of claim 14 wherein each delay stage includes
a first delay cell having a first delay input and a first delay output;
a second delay cell having a second delay input and a second delay output;
a third delay cell having a third delay input and a third delay output;
wherein the first delay input is electrically coupled to a first input node;
wherein the first delay output and the second delay input are electrically coupled to a first joint node, the third delay input is electrically coupled to a second input node, wherein second delay output and the third delay output are electrically coupled to a second joint node; and
wherein the signal strength level of the second delay cell is determined by (M−N), where the signal strength level M is associated with the coarse delay amount, while the signal strength level of the third delay cell determined by N, where 0<N<M; and wherein the propagation delay increases as N increases.

17. The method of claim 11 wherein the signal delay circuit further comprises
a phase detector having a clock input and a DLL input;
a charge pump coupled to the phase detector;
an integration cap coupled to the charge pump;
a current control module coupled to the integration cap; and
a Delay Lock Loop (DLL) circuit including:
a plurality of DLL stages having a DLL circuit input, a DLL circuit output, and the delay code input, wherein the plurality of DLL stages is characterized by a duplicate architecture of the plurality of delay stages;
wherein a clock signal is coupled to the DLL circuit input and the clock input of the phase detector and the DLL circuit output is coupled to the DLL input of the phase detector; and
wherein the current control module is coupled to each delay cell of each delay stage in the plurality of delay stages and the current control module is coupled to each delay cell of each DLL stage of the plurality of DLL stages.

18. The method of claim 17 wherein the current control module includes a first current mirror and a second current mirror, and the first current mirror and the second current mirror is coupled to each delay cell of each delay stage in the plurality of delay stages and each delay cell of each DLL stage in the plurality of DLL stages.

19. The method of claim 18 further comprising providing, by the current control module, a bias control current to the plurality of delay stages in order to synchronize the delayed input signal to the clock signal.

20. The method of claim 18 wherein subjecting the input signal to the desired propagation delay using the hybrid coarse-fine delay cells is free from signal gaps and overlaps due to device mismatch.

* * * * *